(12) United States Patent
Khouri et al.

(10) Patent No.: US 7,319,604 B2
(45) Date of Patent: *Jan. 15, 2008

(54) ELECTRONIC MEMORY DEVICE HAVING HIGH DENSITY NON-VOLATILE MEMORY CELLS AND A REDUCED CAPACITIVE INTERFERENCE CELL-TO-CELL

(75) Inventors: Osama Khouri, Milan (IT); Carlo Caimi, Cinisello Balsamo (IT); Giovanni Mastrodomenico, Vimercate (IT); Paolo Caprara, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 25 days.

This patent is subject to a terminal disclaimer.

(21) Appl. No.: 11/300,053

(22) Filed: Dec. 14, 2005

(65) Prior Publication Data

US 2006/0158931 A1    Jul. 20, 2006

(30) Foreign Application Priority Data

Dec. 14, 2004   (IT)  ........................... MI2004A2373

(51) Int. Cl.
*G11C 7/00*   (2006.01)

(52) U.S. Cl. .................................. 365/53; 365/185.17

(58) Field of Classification Search .................. 365/53, 365/185.17, 185.02, 185.33
See application file for complete search history.

(56) References Cited

U.S. PATENT DOCUMENTS

| | | | |
|---|---|---|---|
| 5,455,793 A | * | 10/1995 | Amin et al. ............ 365/185.26 |
| 2003/0201487 A1 | | 10/2003 | Yang et al. .................. 257/314 |
| 2003/0210582 A1 | | 11/2003 | Kinoshita .................... 365/200 |
| 2004/0232496 A1 | | 11/2004 | Chen et al. .................. 257/390 |

FOREIGN PATENT DOCUMENTS

EP   1435657   7/2004

* cited by examiner

*Primary Examiner*—Vu A. Le
(74) *Attorney, Agent, or Firm*—Lisa K. Jorgenson; Allen, Dyer, Doppelt, Milbrath & Gilchrist, P.A.

(57) ABSTRACT

An electronic memory device with a high density of non-volatile memory cells has a reduced capacitance cell-to-cell interference. The memory cells are integrated on a semiconductor substrate and are organized in a matrix of cells with word lines and bit lines connected to the cells. Each memory cell includes at least one floating gate transistor having a floating gate region projecting from the substrate, and a control gate region capacitively coupled to the floating gate region. Between the cells of opposite word lines, a lateral coating is provided that includes at least one conductive layer floating along the direction of the bit lines.

31 Claims, 8 Drawing Sheets

ELECTRONIC MEMORY DEVICE HAVING HIGH DENSITY NON-VOLATILE MEMORY CELLS AND A REDUCED CAPACITIVE INTERFERENCE CELL-TO-CELL

FIELD OF THE INVENTION

The present invention relates to an electronic memory device comprising high density non-volatile memory cells with floating gates, and with a reduced capacitive coupling cell-to-cell interference.

More specifically, the non-volatile memory cells are integrated on a semiconductor substrate, and comprise a plurality of cells organized in a matrix of rows and columns. The memory cells may be of the Flash NAND type, and the following description is made with reference to this field of application by way of illustration only.

BACKGROUND OF THE INVENTION

Non-volatile electronic memory devices are widely used in several apparatuses, such as cell phones, digital cameras, notebooks, etc., where storing a considerable amount of information in a compact memory with high capacity is required.

Figures 1, 2, 3, 4, 5:
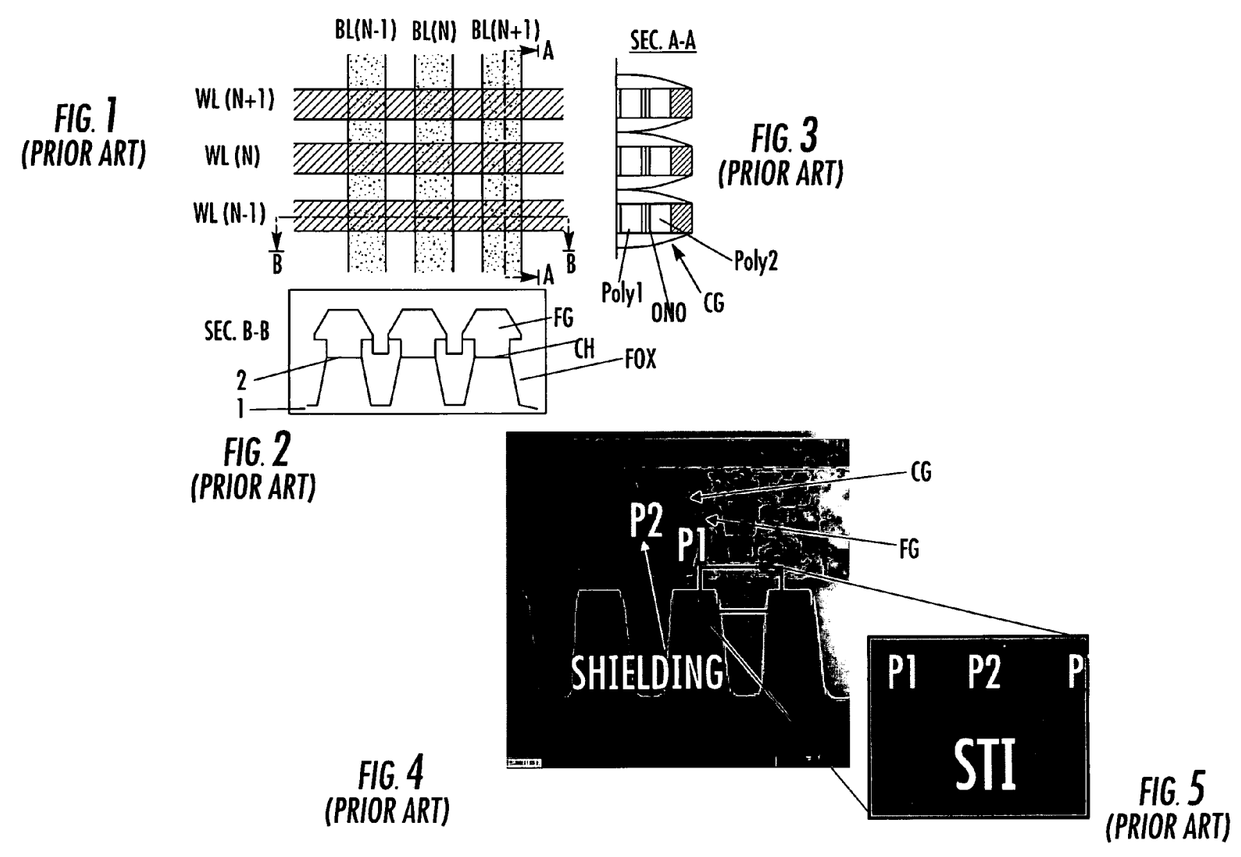
FIGS. 1, 2 and 3 schematically show, respectively, a view from above, a section along axis A-A, and a section along axis B-B of a portion of a non-volatile memory device according to the prior art.
FIGS. 4 and 5 respectively show a section along a word line, through a microscope, of a memory device and an enlarged detail between two consecutive floating gates formed according to the prior art.

Semiconductor integrated non-volatile memory devices have been developed, which comprise a plurality of memory cells organized in a matrix, i.e., the cells are organized in rows called word lines WL and columns called bit lines BL, as shown in FIG. 1. The memory cells or active areas are realized, as partially shown in FIG. 2, in a semiconductor substrate 1 and are separated from each other by portions of a field oxide layer FOX.

Each cell comprises a floating gate transistor with a floating gate region FG above a channel region CH or tunnel oxide formed in the semiconductor substrate 1. The floating gate regions FG are separated from one another along the word lines, as highlighted in FIG. 4 and in the detail illustration of FIG. 5, by an STI layer and by the layers P1 and P2. The STI layer is made of a layer of ONO (oxide, nitride, oxide, the layer P2 is made of a conductive shield such as polysilicon, and the layer P1 is made of ONO, for example.

A control gate region CG is then capacitively coupled to the floating gate region by an interposition of more dielectric layers overlapped to form a layer of the ONO (oxide/nitride/oxide), as shown in FIG. 3.

Each cell has drain, source and body regions. In a matrix-like organization, via metal electrodes, only the drain of the select transistor is contacted near the last cell of the bit line, i.e., the DSL and the source of the transistor near the first cell of the bit line called SSL. The control gate regions are contacted so as to apply predetermined voltage values to the memory cells.

The charge stored in the floating gate region FG determines the logic state of the cell modifying its threshold voltage. The main feature of the memory cell is that of having two states, one with a low or erased threshold voltage, which corresponds to an erased cell, and one with a high or programmed threshold voltage which corresponds to a written cell. Different conventions can be provided. The voltage is externally applied through the control gate region CG, but the electrode effectively controlling the state of the channel is the floating gate region FG.

The need of storing, in a more reduced space, a greater amount of data has led to the development of devices with multilevel memory cells, wherein different logic states are stored in each cell.

For devices with multilevel memory cells, and in particular with cells of the Flash NAND type, the accurate control of the threshold distributions of the cells becomes fundamental so that they are correctly placed below the erase verify potential, for the erased cells, and between the program verify values and the Vpass programmed values for the written cells. The Vpass voltages are the threshold values relative to the voltages associated with the different logic states stored, and their value depends on the number of bits that can be stored in the same cell.

During the programming of a Flash NAND cell, a lot of attention has been paid to the presence of the effective disturbances which could vary the voltage stored in the cell and cause a variation of the voltages stored in the adjacent cells. This is a phenomenon called "widening of the distributions".

In non-volatile memory devices the undesired capacitive cell-to-cell couplings are among the main contributors for the "widening of the distributions". In multilevel devices the "widening of the distributions" is more damaging since the thresholds relative to the different values or logic states are separated within narrow voltage intervals.

Figure 9:
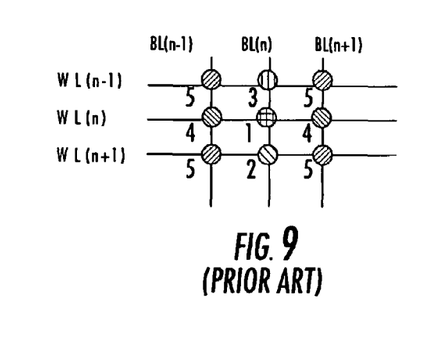
FIGS. 9, 10 and 11 respectively show an exemplary scheme of a device comprising nine memory cells connected by word lines and bit lines, a diagram reporting the voltage of the word lines according to the percentages of stored cells, and an enlargement of this diagram according to the prior art.

In a memory of the Flash NAND type, with a high density, the main parasitic capacitive components are identified, with reference to FIG. 9, with the capacitances along:

1. the direction Y of the bit lines;
2. the direction X of the word lines; and
3. direction XY diagonal couplings.

The three parasitic capacitances identified show different values from each other and, typically in the order indicated, they show decreasing values.

Figure 6:
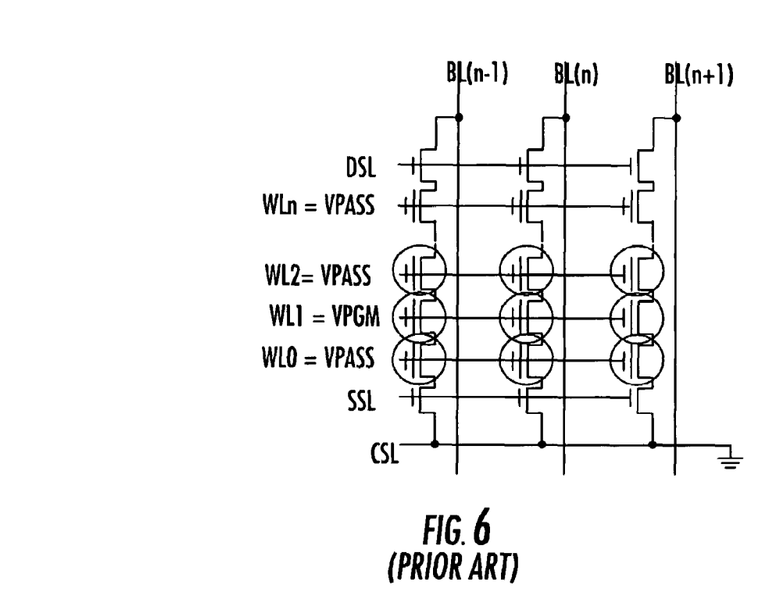
FIG. 6 shows an electrical circuit corresponding to a memory device formed according to the prior art.

Problems of modification of the voltages in the cells and thus of "widening of the distributions" show up when the cells themselves are programmed. In fact, with particular reference to FIG. 6, during the programming of the cells blackened in the drawing there is a modification of the voltages of the corresponding floating gate regions which allow the formation of parasitic capacitances causing a variation of the voltage of the floating gate regions FG of the cell arranged centrally (not blackened in the drawing WL1-BL(n)).

From some experimental data detected and reported in FIGS. 7 to 10, it has been possible to observe, on a block of a non-volatile memory device comprising nine cells, the structure of the parasitic capacitances and to carry out a measuring thereof.

Figure 7:
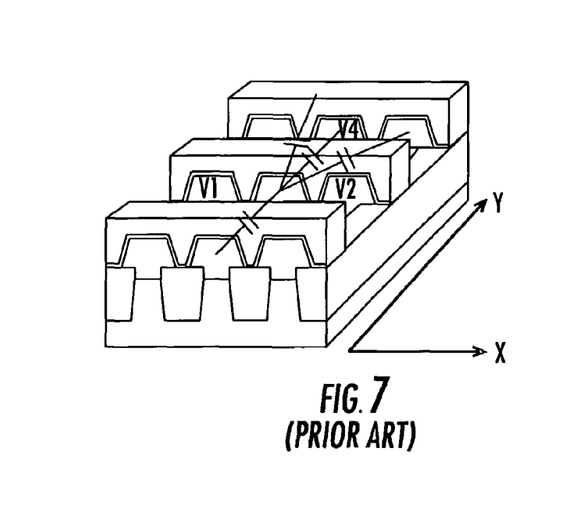
FIGS. 7 and 8 respectively show a perspective view and the corresponding electrical circuit of a device formed according to the prior art.
Figure 8:
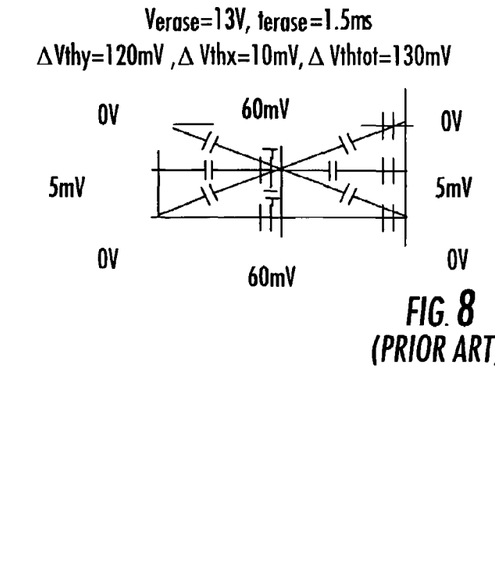

In the example shown in FIG. 7, considering the central cell as the detecting one and considering that the adjacent cells had been erased by a voltage equal to 13V and programmed with an ISPP process, i.e., with a $\Delta V_{step}=0.5V$ and $t_{step}=20$ µs, a total value of the threshold value has resulted, due to all the parasitic capacitances which have been formed, equal to 130 mV which is of course a relevant value.

Figure 10:
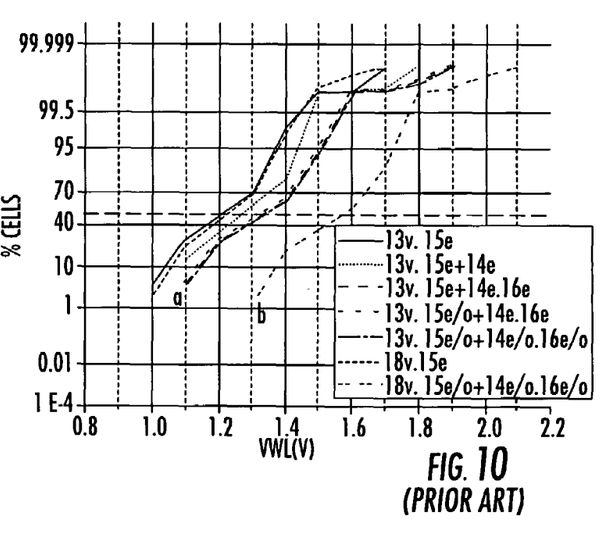
Figure 11:
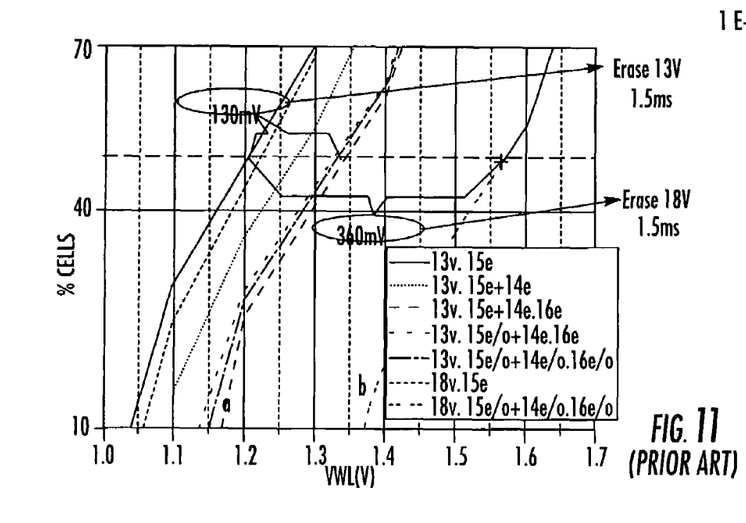

On the same block of cells, moreover, two different measurements of the parasitic capacitances have been detected further to two different formulations and reported in FIGS. 10 and 11.

For the first detection the block of cells had been erased with an erase verify value of about 13V in a time t=1.5 ms, while for the second detection the erase verify erase value was of about 18V in a time t=1.5 ms. For both the detections a programming sequence of the cells has been followed corresponding to the increasing numbers indicated from 1 to 5 in FIG. 9.

In FIG. 10 the values of the total coupling effect on the cells are reported, measured in threshold voltage, due to the parasitic capacitances. The curve indicated with the letter a represents the progress of the threshold voltage due to the coupling capacitances of the cells which had initial voltage values lower than $Vth_{start} \leq -0.7V$, which according to the current standards, occur with erase verify values equal to 13V. With the letter b the curve is instead indicated when the cells have initial voltage values lower than $Vth_{start} \leq -4V$, i.e., with erase verify values equal to 18V.

FIG. 11 shows an enlargement of FIG. 10 and the cells highlighted in the same row have been programmed by ISPP, i.e., with identical values of $\Delta V_{step}=0.5V$ and $t_{step}=2$ µs. As can be observed from this enlargement, the threshold voltage is transferred to the central cell and this is due to the totality of the parasitic capacitances and is equal to 130 mV during the first detection according to the curve a, and is equal to 360 mV during the second detection, i.e., curve b.

This confirms how the value of the parasitic capacitances significantly influences the threshold voltages of the single cells, and thus the correctness of the programmable and programmed values.

Several approaches are known to reduce the capacitances of type 2 along the direction X of the word lines in the devices of non-volatile memory cells.

Figure 12:
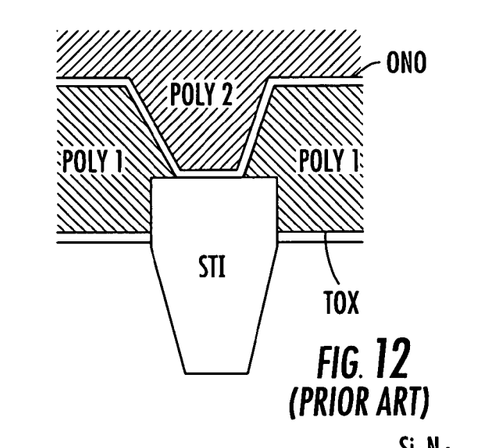
FIGS. 12 and 13 show two memory devices formed according to the different known prior art techniques.

A straightforward and efficient approach, for example, is shown in European Patent Application No. 02425805.5, which discloses filling in the space between two adjacent floating gate regions of cells belonging to the same word lines with a material having a low dielectric constant, as shown in FIG. 12. European Patent Application No. 02425805.5 is assigned to the current assignee of the present invention, and is incorporated herein by reference in its entirety.

Figure 13:
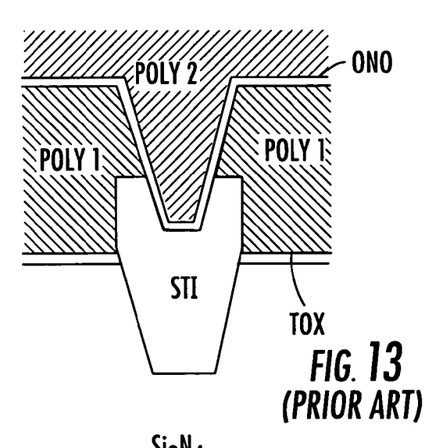

A further known approach is shown in U.S. Patent Application No. 2004/0012998 to Chien et al., which discloses reducing the capacitive effects of the floating gate regions along the direction of the word lines due to a particular conformation of the word lines themselves in correspondence with an insulating layer or gate oxide STI, interposed between two adjacent floating gate regions FG. This approach, shown in FIG. 13, provides a trench in correspondence with the insulation layer STI allowing an increase in the lateral insulation between the floating gate regions, and an increase in the volume and the area interposed between the floating gate regions and the word lines.

All these approaches reduce the parasitic capacitances in the direction X. However, they do not teach how to reduce the parasitic capacitances along the axis Y.

Figure 14:
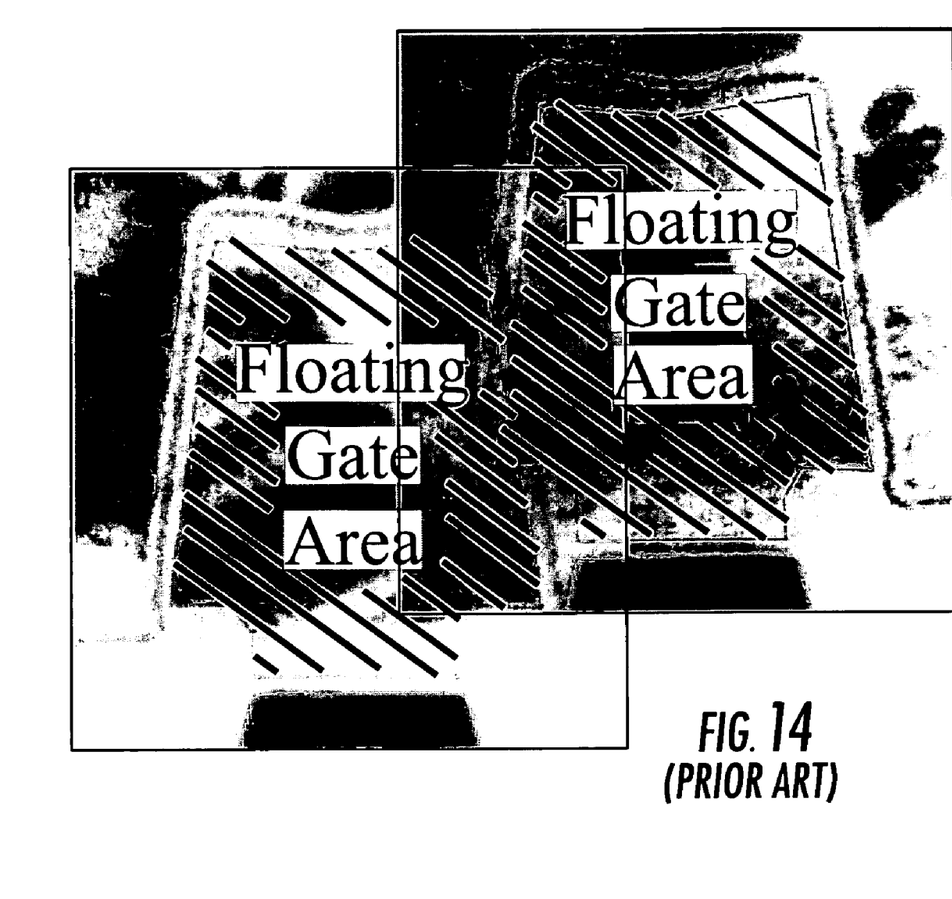
FIGS. 14 and 15 respectively show a schematic view of two opposite floating gate regions belonging to two consecutive word lines of a memory device and the respective electrical circuit formed according to the prior art.
Figure 15:
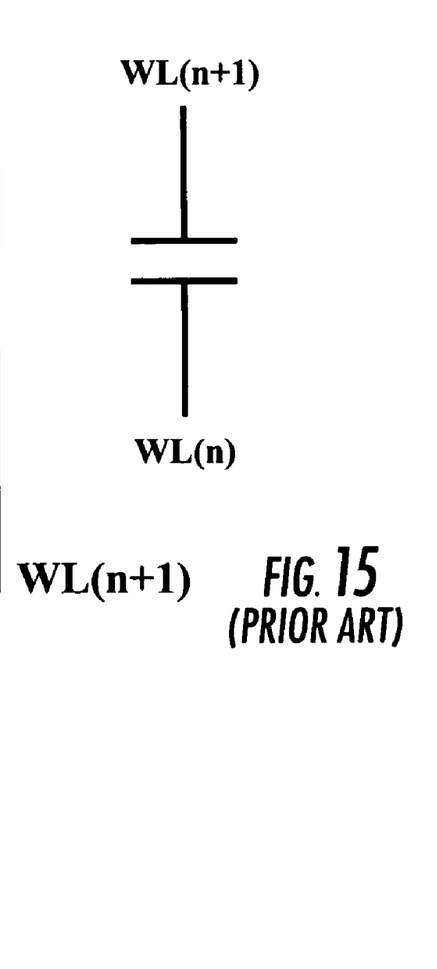

The parasitic capacitive coupling which is realized along the axis Y is due to the fact that between the word lines an insulating layer is interposed and that two opposite floating gate regions FG, arranged on two consecutive word lines, realize two plates of one capacitor, as highlighted in FIGS. 14 and 15.

This phenomenon has increased along with the increase in the density of the memory cells on the same device, and thus along with the decrease of the distance between the floating gates of cells placed on opposite word lines.

To limit the couplings in the direction Y techniques can be used by varying the geometric dimensions of the floating gate regions. For example, a technique reduces the height of the floating gate regions which reduces the opposite surface.

These approaches, however, show some drawbacks. In fact, the designation of the dimensions of the floating gate regions influences the programming voltage value and the threshold values which are, especially in the case of a multilevel memory cell device, important values for operation of the device itself. It is thus necessary not to excessively reduce the dimensions of the floating gate regions.

A further known approach to reduce the parasitic capacitances between the floating gate regions uses programming techniques of the non-volatile memory devices with ramp voltages. The main drawback of this approach is that high programming voltages are required.

A further known approach avoids the interposition, between the word lines, of materials with high dielectric constants, such as for example, silicon nitride, or reducing the amount of interposed dielectric.

Figure 16:
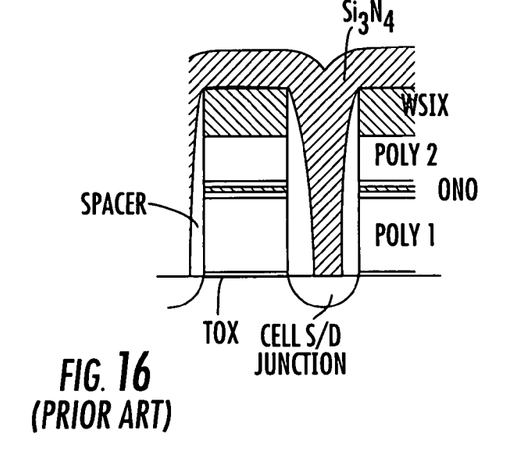
FIGS. 16 and 17 show two sections formed along the bit lines of a memory device according to two different known prior art techniques.

Generally, as highlighted in FIG. 16, the floating gate regions of non-volatile cell memory devices have lateral spacers partially overhanging the source and drain regions of the present NMOS and PMOS transistors, which are covered by a dielectric layer.

Figure 17:
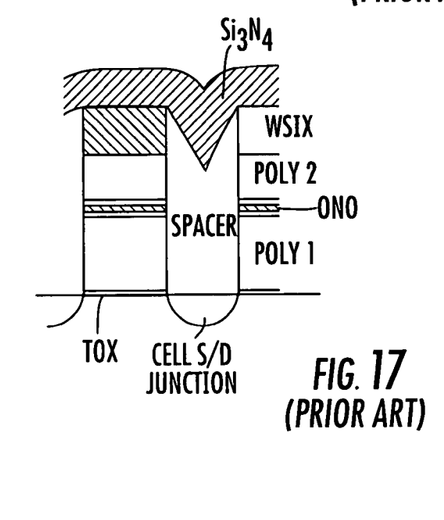

To reduce the amount of dielectric material interposed between the word lines, a known approach increases the length of the spacers, as highlighted in FIG. 17, for example, so that between two opposite floating gate regions arranged on consecutive word lines, there is at least a partial union between the spacers.

This for example, however, shows the drawback that the spacers influence, in a fundamental way, the circuitry of the device. It is thus necessary to take into account the final length of the spacers in relation with the breakdown feature of the present NMOS and PMOS transistors.

SUMMARY OF THE INVENTION

An object of the present invention is to provide a non-volatile memory cell device of the Flash NAND type, organized in a matrix, and having structural and functional characteristics that allow a reduction in the capacitive coupling between opposite floating gate regions along consecutive word lines, thus overcoming the drawbacks of the devices formed according to the prior art.

This and other objects, advantages and features in accordance with the present invention are provided by a biased or floating conductive shield interposed between the rows or word lines of the matrix.

An electronic memory device may comprise a semiconductor substrate, and a plurality of non-volatile memory cells integrated on the semiconductor substrate. The memory cells may be organized in a matrix of rows and columns. Each memory cell may comprise at least one floating gate transistor comprising a floating gate projecting from the semiconductor substrate, and a control gate capacitively coupled to the floating gate. A plurality of word lines may be connected to the rows of the matrix, and a plurality of bit lines may be connected to the columns of the matrix. A coating comprising at least one floating conductive layer may be between memory cells of opposite word lines.

Another aspect is directed to a method for making an electronic memory device as defined above.

BRIEF DESCRIPTION OF THE DRAWINGS

The characteristics and the advantages of the device according to the invention will be apparent from the following description of an embodiment thereof given by way of a non-limiting example with reference to the annexed drawings. In these drawings.

DETAILED DESCRIPTION OF THE PREFERRED EMBODIMENTS

Figure 18:
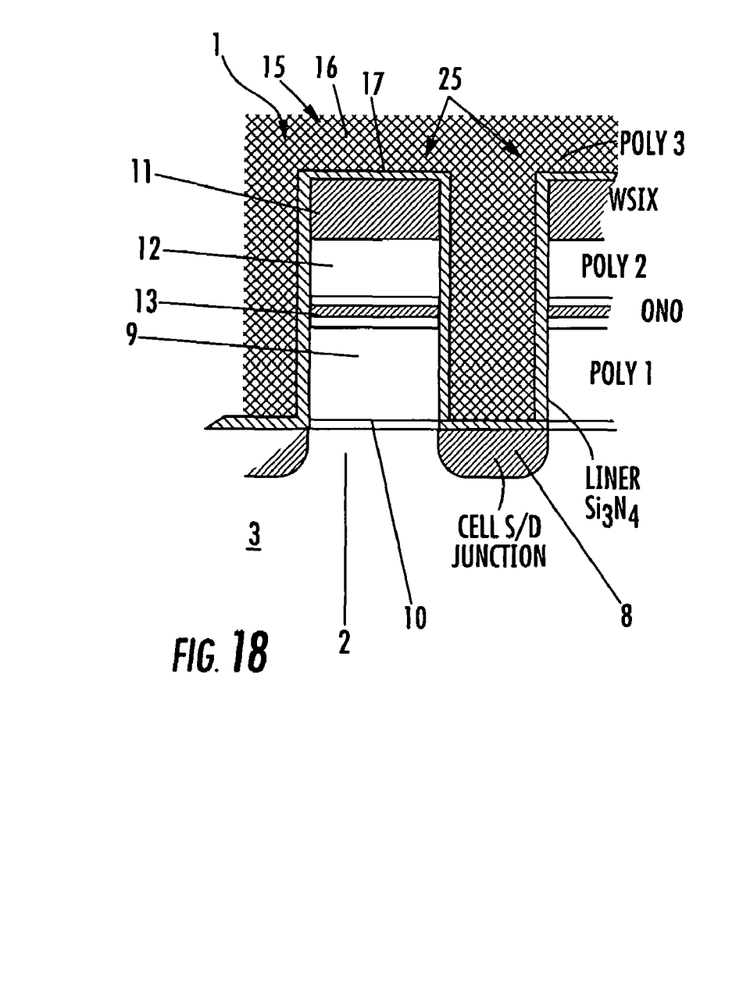
FIGS. 18 and 19 show a memory device formed according to the present invention.
Figure 19:
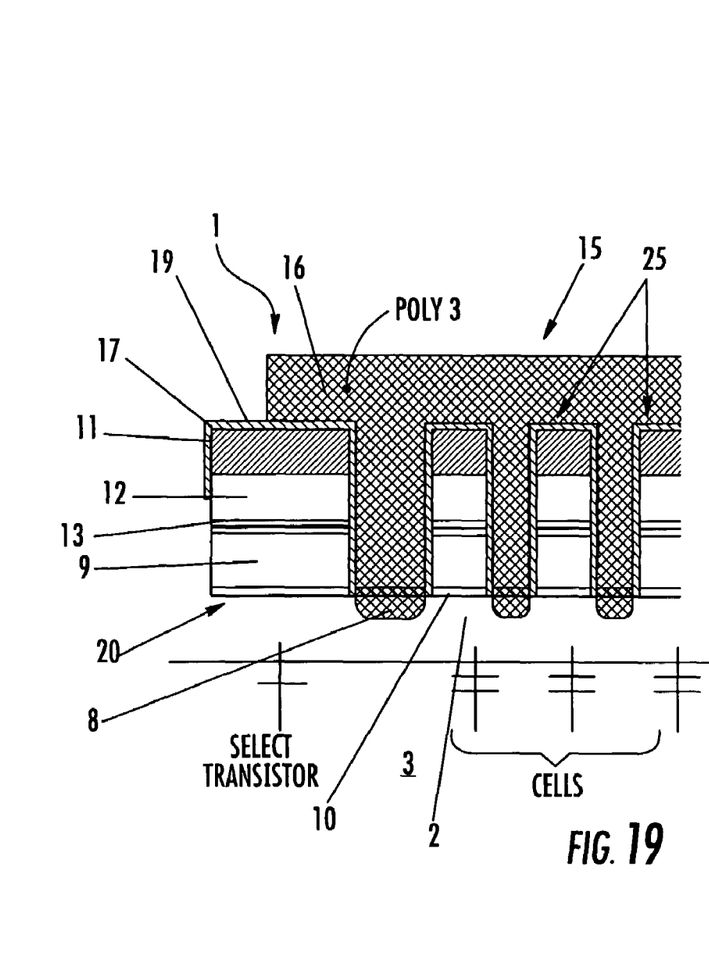

With reference to FIGS. 18 and 19, a portion 1 of a non-volatile memory device will be described. The memory device is high density, and is integrated on a semiconductor substrate 3 of the type comprising a plurality of non-volatile Flash NAND memory cells 2 organized in a matrix of cells.

Figure 24:
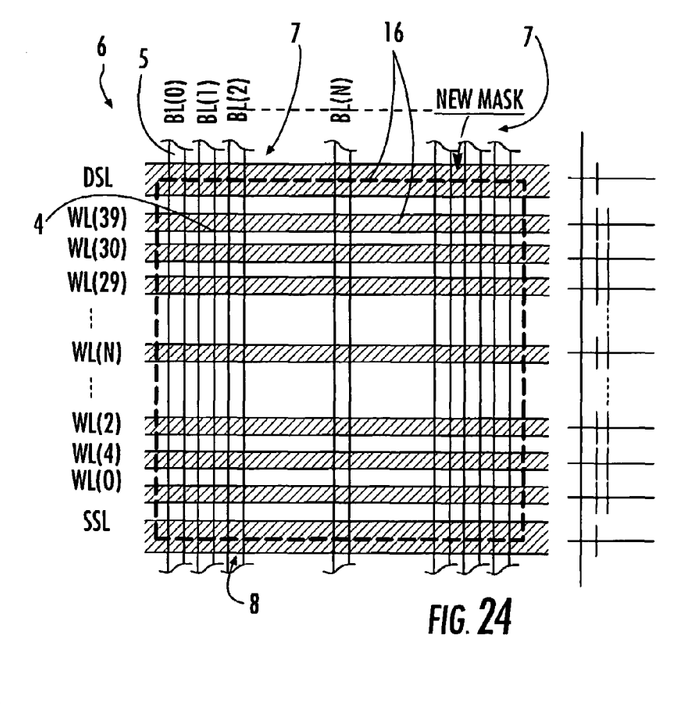
FIG. 24 shows a view from above of a memory device formed according to the present invention.

The matrix comprises a plurality of rows or word lines 4 arranged as shown in FIG. 24 along the direction X, and columns or bit lines 5 arranged along the direction Y. The word lines 4 and bit lines 5 identify each non-volatile memory cell 2 in the matrix realized in the substrate 3.

Figure 20:
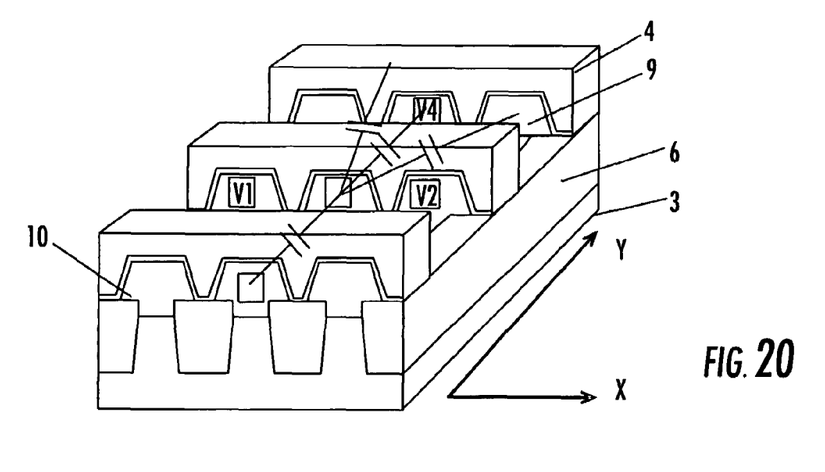
FIG. 20 shows a perspective view of a memory device according to an incomplete representation, wherein the word lines and the floating gate regions are highlighted according to the present invention.

The device 1 comprises, as highlighted in FIG. 20, a plurality of insulating layers STI 6 projecting from the substrate 3 and organized in columns along the direction Y parallel to the bit lines 5.

Each cell 2 comprises a transistor of the MOS type with a floating gate and has, along the direction X, as shown in FIG. 20, a floating gate region 9 realized above a channel region 10, interposed between two consecutive insulating layers or STI 6.

A control gate region 12 is capacitively coupled to the floating gate region 9, as highlighted in particular in FIG. 18, through an overlapping of one or more dielectric layers 13, such as for example, ONO (oxide/nitride/oxide). A silicide layer WSix 11 placed above the control gate region 12 defines a plurality of structures 25.

Each cell 2 also comprises a floating gate transistor, with an architecture of the NAND type, which has a body region not identified in the figures, and a source-drain junction 8 realized in correspondence with the direction Y of FIG. 20, interposed between the structures 25 placed on consecutive word lines 4 in correspondence with each bit line 5.

Advantageously, according to the invention, a coating 15 is present above the structures 25, the control gates 12, the floating gate regions 9 and the source-drain junctions 8 in the direction Y of the bit lines 5 realized starting from the substrate 3. This coating 15 comprises at least one conductive layer 16 which can be floating or suitably biased.

Advantageously, according to the present embodiment, the coating 15 also comprises a thin insulating layer 17 interposed between the upper surface of the substrate 3 and the conductive layer 16 which serves as a shield between the two opposite structures 25 arranged in two consecutive word lines 4, as shown in FIG. 18. Moreover, the thin insulating layer 17 avoids possible short-circuits between the substrate 3 and the overlapped conductive layer 16.

The thin insulating layer 17 can for example have a thickness of about 100 Angstroms. This value can vary according to the technology and to the techniques used. The thin insulating layer 17 laterally covers each structure 25 along the bit lines 5 allowing it to insulate in particular each floating gate region 9 laterally in the direction Y.

Moreover, the conductive layer 16 arranged above the thin insulating layer 17, suitably floating or biased, interposed between the opposite floating gate regions 9, along the direction Y, allows it to minimize or eliminate the capacitive couplings along the bit lines 5. The conductive layer 16 can be for example, but not exclusively, a polysilicon layer such as titanium, or a suitably doped polysilicon, or a refractory metal being thermally compatible with the process and the technology suitable to realize the device 1.

The thin insulating layer 17 can be a silicon nitride, a silicon oxide or other insulating material compatible with the realization process and the technology used. Moreover, the thin insulating layer 17 can be obtained by a deposition or growing process.

Thus, advantageously, the coating 15 creates a conductive shield which allows a capacitive partition of the parasitic capacitances to be formed, which could be formed between the opposite floating gate regions 9 arranged on consecutive word lines 4. This allows the total capacity in the direction Y to be significantly reduced.

To realize the suitable circuitry elements for example, as shown in FIG. 19, above a select transistor 20, the conductive layer 16 can be removed by a removal process realizing upper contact areas 19 accessible from the outside.

The coating 15 is realized on the matrix, and in particular, preferably on the word lines 4 along the bit lines 5 and on part of the select transistors 20 along the direction Y except from the contact points which, as known in non-volatile memory devices 1 organized in a matrix, are arranged in correspondence with the peripheral edge 21 as shown in FIG. 24. The present invention is suitable for variations, all falling within the same protective scope. For example, in FIG. 21 a further embodiment is highlighted. Hereafter in the description, the same numbers as those previously used to identify corresponding parts will be used.

Figure 21:
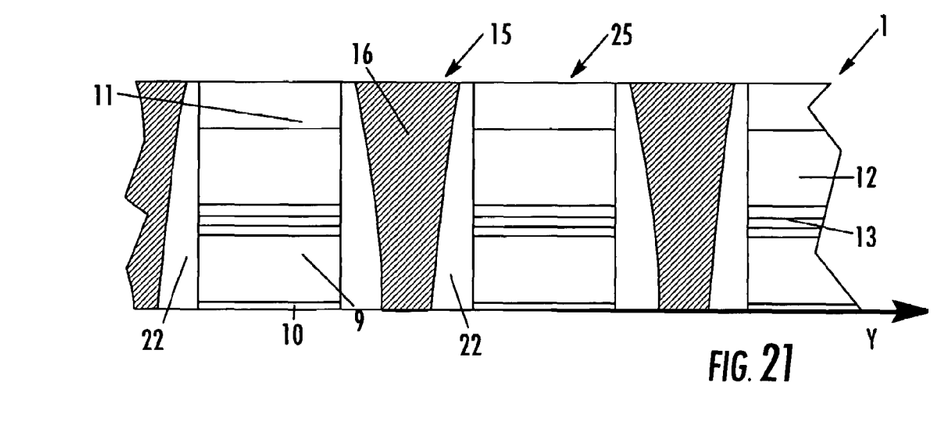
FIG. 21 shows a further embodiment of a device formed according to the present invention.

A non-volatile memory device 1 organized in a matrix of cells, has word lines and bit lines connected to the cells, has a plurality of structures 25 described above and of the type comprising floating gate regions 9, realized above a channel region 10. Each structure 25 comprises a control gate region 12 capacitively coupled to the floating gate region 9 through an overlapping of one or more dielectric layers 13, such as ONO (oxide/nitride/oxide), for example. Each structure 25 comprises, above the control gate region 12, a silicide layer 11.

Laterally, each structure 25 comprises a plurality of spacers 22 which are arranged parallel to the direction X of the word lines. The direction X in FIG. 21 is not indicated but it is perpendicular to the plan of the drawing itself while the direction Y of the bit lines is indicated. The spacers 22 allow for the device 1, a so-called LDD structure to be formed in the circuitry.

Advantageously, a coating 15 laterally covers along the direction Y, and possibly in the upper part of each structure 25. This coating 15 comprises a conductive layer 16, which occupies all the space interposed between the spacers 22 of the opposite structures 25 along the direction Y, and placed on consecutive word lines.

Advantageously, between the opposite floating gate regions 9 along the direction Y, the conductive layer 16 is interposed between insulating spacers 22. In particular, in this embodiment the conductive layer 16 of the coating 15 creates, together with the spacers 22, a conductive shield which allows a partition of the capacitances to be formed, thus reducing the total parasitic capacitance in the direction Y.

To complete the device 1 by a known technique, the conductive layer 16 together with the circuitry structure are planarized by a CMP process which allows the device 1 to be compatible with the successive process steps.

Figure 22:
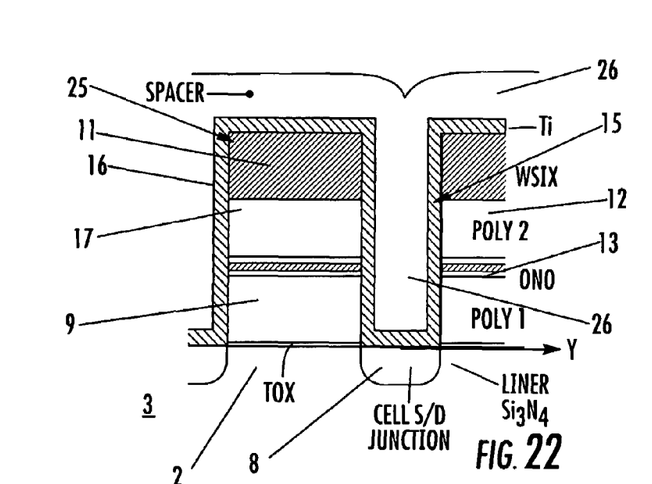
FIGS. 22 and 23 show a device formed according to a further embodiment of the present invention.
Figure 23:
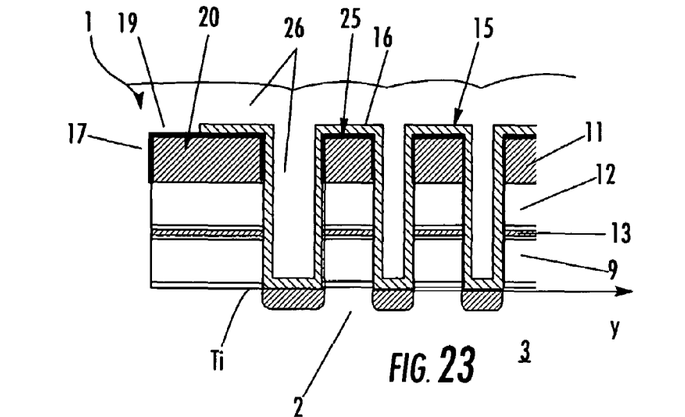

A further embodiment is shown in FIGS. 22 and 23. According to this embodiment, a non-volatile memory device 1 integrated on a semiconductor 3 and organized in matrix of cells, with word lines and bit lines connected to the cells, has a plurality of non-volatile memory cells 2.

The device 1 along the direction Y comprises a plurality of structures 25, of the above described type, each one comprising a floating gate region 9 capacitively coupled to an upper control gate 12 by one or more dielectric layers 13 and a silicide layer 11 arranged on top.

Each cell 2 also comprises a floating gate transistor, with an architecture of the NAND type, which has a body region, not identified in the figures, and a source-drain junction 8 realized in correspondence with the direction Y interposed between a structure 25 and the successive one.

Advantageously, along the direction Y a continuous coating 15 is present, arranged on the matrix above the substrate 3 at least along the bit lines and on part of the selectors realized for the contact, as shown in FIGS. 23 and 24.

The coating 15 comprises at least one continuous conductive layer 16 which covers, in a shaped way, along the direction Y, the plurality of structures 25 and the interposed source-drain junctions 8. The shaped conductive layer 16 laterally covers, along the direction Y, the plurality of structures 25, and in particular the floating gates 9.

The conductive layer 16 can be for example a titanium layer, but it could be realized also with different conductive materials according to the technologies used. Suitably, the coating 15 also comprises at least one thin insulating layer 17 interposed between the upper surface of the substrate 3 and the shaped conductive layer 16 to avoid possible contacts.

According to this embodiment, a suitable continuous spacer layer 26 is present above the coating 15. In particular, the spacer layer 26 suitably covers the gap between each structure 25 and the successive one along the direction Y above the source-drain junctions 8, and possibly suitably covering the structures 25.

The coating 15 defines, also in this embodiment, a conductive shield between the opposite floating gate regions 9 and thus realizes a physical separation between the floating gate regions reducing the parasitic capacitances in the direction Y along the bit lines.

In the presence of select transistors 20 it is possible, by a removal process, to remove the conductive layer 16 for realizing the suitable circuit elements, as shown in FIG. 23.

The non-volatile memory cell device realized by way of the present invention has a coating 15 or conductive or floating shield which allows the parasitic capacitances to be limited which would have to be created between the floating gate regions 9 arranged on consecutive word lines 4 along the direction of the bit lines 5, i.e., along the direction Y. It also allows a reduction in the interaction and disturbance problems both in the storing and erasing or reading step of the values inserted in the cells 2.

That which is claimed is:

1. An electronic memory device comprising:
    a semiconductor substrate;
    a plurality of non-volatile memory cells integrated on said semiconductor substrate and organized in a matrix of rows and columns, each memory cell comprising at least one floating gate transistor comprising a floating gate and a control gate capacitively coupled to said floating gate; and
    a plurality of word lines connected to the rows of the matrix;
    a plurality of bit lines connected to the columns of the matrix; and
    a coating comprising at least one floating conductive layer between memory cells of opposite word lines.

2. An electronic memory device according to claim 1, wherein said coating laterally extends on said memory cells along a direction of the plurality of bit lines.

3. An electronic memory device according to claim 1, wherein said coating extends on the opposite word lines along a direction of the plurality of bit lines.

4. An electronic memory device according to claim 1, wherein said coating further comprises at least one insulating layer interposed between said floating gates and said at least one floating conductive layer.

5. An electronic memory device according to claim 1, further comprising a silicide layer above said control gates and forming with said underlying floating gates a plurality of structures having lateral spacers in a direction of said plurality of bit lines; and wherein said coating covers at least one of said plurality of structures and the lateral spacers.

6. An electronic memory device according to claim 1, further comprising a silicide layer above said control gates and forming with said floating gates a plurality of structures; and wherein said coating covers at least laterally said plurality of structures and comprises at least one insulating layer interposed between said floating gates and said at least one floating conductive layer, said at least one insulating layer laterally extending to said plurality of underlying structures in a direction of said plurality of bit lines, and a spacer layer above said coating completely covering said semiconductor substrate.

7. An electronic memory device according to claim 1, further comprising at least one select transistor connected to a respective bit line; and wherein said coating partially covers said at least one select transistor.

8. An electronic memory device according to claim 1, wherein said at least one floating conductive layer comprises polysilicon.

9. An electronic memory device according to claim 1, wherein said at least one floating conductive layer comprises a refractory metal.

10. An electronic memory device according to claim 1, wherein said at least one floating conductive layer comprises a titanium layer.

11. An electronic memory device according to claim 4, wherein said at least one insulating layer comprises silicon nitride.

12. An electronic memory device according to claim 4, wherein said at least one insulating layer comprises silicon oxide.

13. An electronic memory device comprising:
a semiconductor substrate;
a plurality of non-volatile memory cells integrated on said semiconductor substrate and organized in a matrix of rows and columns, each memory cell comprising at least one floating gate transistor comprising a floating gate and a control gate capacitively coupled to said floating gate; and
a plurality of word lines connected to the rows of the matrix;
a plurality of bit lines connected to the columns of the matrix; and
a coating comprising
at least one floating conductive layer between memory cells of opposite word lines, and comprising polysilicon and a refractory metal, and
at least one insulating layer interposed between said floating gates and said at least one floating conductive layer.

14. An electronic memory device according to claim 13, wherein said coating laterally extends on said memory cells along a direction of the plurality of bit lines.

15. An electronic memory device according to claim 13, wherein said coating extends on the opposite word lines along a direction of the plurality of bit lines.

16. An electronic memory device according to claim 13, further comprising a silicide layer above said control gates and forming with said underlying floating gates a plurality of structures having lateral spacers in a direction of said plurality of bit lines; and wherein said coating covers at least one of said plurality of structures and the lateral spacers.

17. An electronic memory device according to claim 13, further comprising a silicide layer above said control gates and forming with said floating gates a plurality of structures; and wherein said coating covers at least laterally said plurality of structures and comprises at least one insulating layer interposed between said floating gates and said at least one floating conductive layer, said at least one insulating layer laterally extending to said plurality of underlying structures in a direction of said plurality of bit lines, and a spacer layer above said coating completely covering said semiconductor substrate.

18. An electronic memory device according to claim 13, further comprising at least one select transistor connected to a respective bit line; and wherein said coating partially covers said at least one select transistor.

19. An electronic memory device according to claim 13, wherein said at least one insulating layer comprises silicon nitride.

20. An electronic memory device according to claim 13, wherein said at least one insulating layer comprises silicon oxide.

21. A method for making an electronic memory device comprising:
forming a plurality of non-volatile memory cells on a semiconductor substrate, the memory cells being formed in a matrix of rows and columns, each memory cell being formed comprising at least one floating gate transistor comprising a floating gate and a control gate capacitively coupled to the floating gate;
connecting a plurality of word lines to the rows of the matrix;
connecting a plurality of bit lines to the columns of the matrix; and
forming a coating comprising at least one floating conductive layer between memory cells of opposite word lines.

22. A method according to claim 21, wherein the coating laterally extends on the memory cells along a direction of the plurality of bit lines.

23. A method according to claim 21, wherein the coating extends on the opposite word lines along a direction of the plurality of bit lines.

24. A method according claim 21, wherein the coating further comprises at least one insulating layer interposed between the floating gates and the at least one floating conductive layer.

25. A method according to claim 21, further comprising forming a silicide layer above the control gates and forming with the underlying floating gates a plurality of structures having lateral spacers in a direction of the plurality of bit lines; and wherein the coating covers at least one of the plurality of structures and the lateral spacers.

26. A method according to claim 21, further comprising forming a silicide layer above the control gates and forming with the floating gates a plurality of structures; and wherein the coating covers at least laterally the plurality of structures and comprises at least one insulating layer interposed between the floating gates and the at least one floating conductive layer, the at least one insulating layer laterally extending to the plurality of underlying structures in a direction of the plurality of bit lines, and forming a spacer layer above the coating for completely covering the semiconductor substrate.

27. A method according to claim 21, further comprising forming at least one select transistor connected to a respective bit line; and wherein the coating partially covers the at least one select transistor.

28. A method according to claim 21, wherein the at least one floating conductive layer comprises at least one of polysilicon, a refractory metal, and titanium.

29. A method according to claim 24, wherein said at least one insulating layer comprises at least one of a silicon nitride and a silicon oxide.

30. A method according to claim 24, wherein a deposition process forms the at least one insulating layer.

31. A method according to claim 24, wherein a growing process formed the at least one insulating layer.

* * * * *

UNITED STATES PATENT AND TRADEMARK OFFICE
CERTIFICATE OF CORRECTION

PATENT NO. : 7,319,604 B2  Page 1 of 1
APPLICATION NO. : 11/300053
DATED : January 15, 2008
INVENTOR(S) : Khouri et al.

It is certified that error appears in the above-identified patent and that said Letters Patent is hereby corrected as shown below:

| | |
|---|---|
| Column 1, Line 43 | Delete: "oxide,"<br>Insert: -- oxide,) -- |
| Column 3, Line 16 | Delete: "= 2"<br>Insert: -- = 20 -- |
| Column 8, Line 45 | Delete: "according claim"<br>Insert: -- according to claim -- |
| Column 10, Line 28 | Delete "according claim"<br>Insert: -- according to claim -- |

Signed and Sealed this

Second Day of September, 2008

JON W. DUDAS
*Director of the United States Patent and Trademark Office*